United States Patent
Cai et al.

(10) Patent No.: US 7,363,553 B2
(45) Date of Patent: Apr. 22, 2008

(54) SYSTEM AND METHOD FOR ADJUSTING SOFT DECISION THRESHOLDS IN A SOFT-DECISION ERROR CORRECTION SYSTEM

(75) Inventors: Yi Cai, Eatontown, NJ (US); Alexei N. Pilipetskii, Colts Neck, NJ (US); Morten Nissov, Ocean, NJ (US)

(73) Assignee: Tyco Telecommunications (US) Inc., Morristown, NJ (US)

( * ) Notice: Subject to any disclaimer, the term of this patent is extended or adjusted under 35 U.S.C. 154(b) by 424 days.

(21) Appl. No.: 10/972,289

(22) Filed: Oct. 22, 2004

(65) Prior Publication Data

US 2005/0154955 A1 Jul. 14, 2005

Related U.S. Application Data

(60) Provisional application No. 60/514,226, filed on Oct. 24, 2003, provisional application No. 60/514,306, filed on Oct. 24, 2003.

(51) Int. Cl.
*H03M 13/00* (2006.01)
(52) U.S. Cl. .................. 714/709; 714/760; 714/780
(58) Field of Classification Search .................... None
See application file for complete search history.

(56) References Cited

U.S. PATENT DOCUMENTS

| 6,198,779 | B1 | 3/2001 | Taubenheim et al. | ....... 375/316 |
|---|---|---|---|---|
| 6,292,126 | B1 | 9/2001 | Chelehmal et al. | ......... 341/155 |
| 6,433,904 | B1 | 8/2002 | Swanson et al. | ............ 359/133 |
| 6,513,136 | B1 | 1/2003 | Barker | ....................... 714/704 |
| 6,792,055 | B1 * | 9/2004 | Hart | ........................... 375/345 |
| 6,879,267 | B2 * | 4/2005 | Yamazaki | .................... 341/64 |
| 7,158,567 | B2 * | 1/2007 | Wang et al. | ................ 375/232 |

OTHER PUBLICATIONS

Notification of Transmittal of the International Search Report and The Written Opinion of the International Searching Authority, or the Declaration mailed Aug. 9, 2005 related to corresponding PCT Patent Application No. PCT/US04/35018.
Ma et al; "Optimal Quantization for Soft-Decision Decoding Revisited"; Oct. 7-11, 2002; International Symposium on Information Theory and Its Application.
Raghavan et al; "Optimum Soft Decision Demodulation for ISI Channels"; Jan. 1993; IEEE Transactions on Communications, vol. 41, No. 1; pp. 83-89.

(Continued)

*Primary Examiner*—Phung M. Chung
(74) *Attorney, Agent, or Firm*—Grossman, Tucker, Perreault & Pfleger, PLLC

(57) ABSTRACT

The soft decision thresholds in a soft decision forward error correction (FEC) system may be adjusted based on mutual information of a detected signal. In one embodiment, a recursive algorithm may be used to optimize threshold values by maximizing the mutual information. In another embodiment, an adaptive scheme may be used to optimize threshold values based on a pre-knowledge of the noise in the channel. In a further embodiment, an adaptive scheme may be used to optimize threshold values by without pre-knowledge of the noise in the channel.

25 Claims, 11 Drawing Sheets

OTHER PUBLICATIONS

Wu et al; "An Adaptive Soft-Decision Quantizer for Digital Communications with Convolutional Coding on a Rayleigh Fading Channel"; 1993; Proceedings of 1993 International Joint Conference on Neural Networks, pp. 447-450.

Wong et al; "An Automatic Procedure to Construct the Optimal Soft-Decision Quantizers and Branch Metrics for Viterbi Decoders"; 1995; IEEE; pp. 423-426.

Jeffrey B. Schodorf; "Optimal Soft-Decision Decoding for a 1-Bit A/D Channel"; 1999; IEEE; pp. 1172-1176.

Jeong et al; "Optimal Quantization for Soft-Decision Turbo Decoder"; 1999; IEEE; pp. 1620-1624.

Antony et al; "An Adaptive Threshold Strategy for Soft Decision Viterbi Decoding"; 2003; IEEE; pp. 1659-1662.

Wu et al; "The Influence of Quantization and Fixed Point Arithmetic Upon the Ber Performance of Turbo Codes" Feb. 1999; IEEE; pp. 1683-1687.

Jeong et al; "Optimal Quantization for Soft-Decision Turbo Decoder"; Apr. 1999; IEEE; pp. 1620-1624.

Ma et al; "Optimal Quantization for Soft-Decision Decoding Revisited"; Oct. 2002.

* cited by examiner

SYSTEM AND METHOD FOR ADJUSTING SOFT DECISION THRESHOLDS IN A SOFT-DECISION ERROR CORRECTION SYSTEM

CROSS-REFERENCE TO RELATED APPLICATIONS

This application claims the benefit of U.S. Provisional Patent Application Ser. No. 60/514,226 filed on Oct. 24, 2003 and U.S. Provisional Patent Application Ser. No. 60/514,306 filed on Oct. 24, 2003, both of which are fully incorporated herein by reference.

TECHNICAL FIELD

The present invention relates to forward error correction (FEC) and more particularly, to soft-decision FEC with soft-decision threshold adjustment.

BACKGROUND INFORMATION

In optical communications systems, an optical signal may be modulated with digital data in order to transmit the data over an optical transmission path. Different parameters of the optical signal may be varied to represent digital data (e.g., the binary digits "0" and "1"). One problem associated with optical communication systems is maintaining the integrity of the data being communicated, particularly when optical signals are transmitted over long distances in long-haul communication systems. Accumulated noise contributed by many different sources in a transmission path may cause degradation of the signals and may cause difficulty in differentiating between the binary digits (i.e., the ones and zeros) in a data stream.

Forward Error Correction (FEC) is a technique used to help compensate for this degradation. FEC is essentially the incorporation of a suitable code into a data stream at the transmitter, for the detection and correction of data errors by the system's receiver. The transmitter receives a data stream and encodes the data stream using an FEC encoder that introduces some redundancy in the binary information sequence of the data stream. The receiver receives the encoded data and runs it through an FEC decoder to detect and correct errors.

Two types of decoding have been used to recover the information bits in the receiver, hard and soft decision decoding. According to hard decision decoding, received samples are compared at the output of the demodulator to an optimal threshold and hard decisions are taken and fed to the decoder where the errors are corrected. For example, a bit is "1" if the signal level exceeds a predetermined level and a bit is "0" if the signal level falls below the predetermined level. According to soft decision decoding, the received samples may be quantized in a multiple bit word and then fed to the decoder. The multiple bits provide "soft" information representing a confidence level in the received data, which may be used to perform more reliable decoding than in the case of hard decision decoding.

Optimization of decision thresholds is desirable in error correction systems. In general, a decision threshold may be considered optimal when the lowest decoded bit error rate (BER) is obtained. In communication systems such as fiber-optic communication systems, however, it may be difficult, if not impossible, to evaluate the BER of customer data and it is also difficult to estimate the decoded BER. In hard detection and decoding systems, the optimal hard-decision threshold may be determined by minimizing the detection error probability. For example, the number of corrected errors reported by the decoder may used in hard-decision systems to estimate the input bit error rate (BER) to the decoder, which should be minimized in threshold adjustment.

However, this method cannot be used to effectively optimize soft-decision thresholds. One reason is that there exists no definition of detection error in soft detection and thus no way to evaluate the detection error probability. In the hard-decision case, adjusting the signal threshold does not affect the FEC capability of the decoder but only changes the input BER, so a minimized input BER corresponds to the best FEC performance and thus the optimal threshold. In multi-bit soft decisions, however, adjusting thresholds affects not only the input BER to the decoder but also the FEC capability of the decoder. From the input BER point of view, the thresholds should be adjusted where least corrected bit errors are reported, while from the FEC capability point of view, maximum number of bit errors should be corrected. Thus, there is a contradiction in minimizing or maximizing corrected bit errors as the criterion for threshold adjustment in a soft-decision system.

Accordingly, there is a need for a system and method of adjusting decision thresholds in a soft decision detection system, which is capable of effectively optimizing the thresholds.

BRIEF DESCRIPTION OF THE DRAWINGS

These and other features and advantages of the present invention will be better understood by reading the following detailed description, taken together with the drawings wherein.

DETAILED DESCRIPTION

Figure 1:
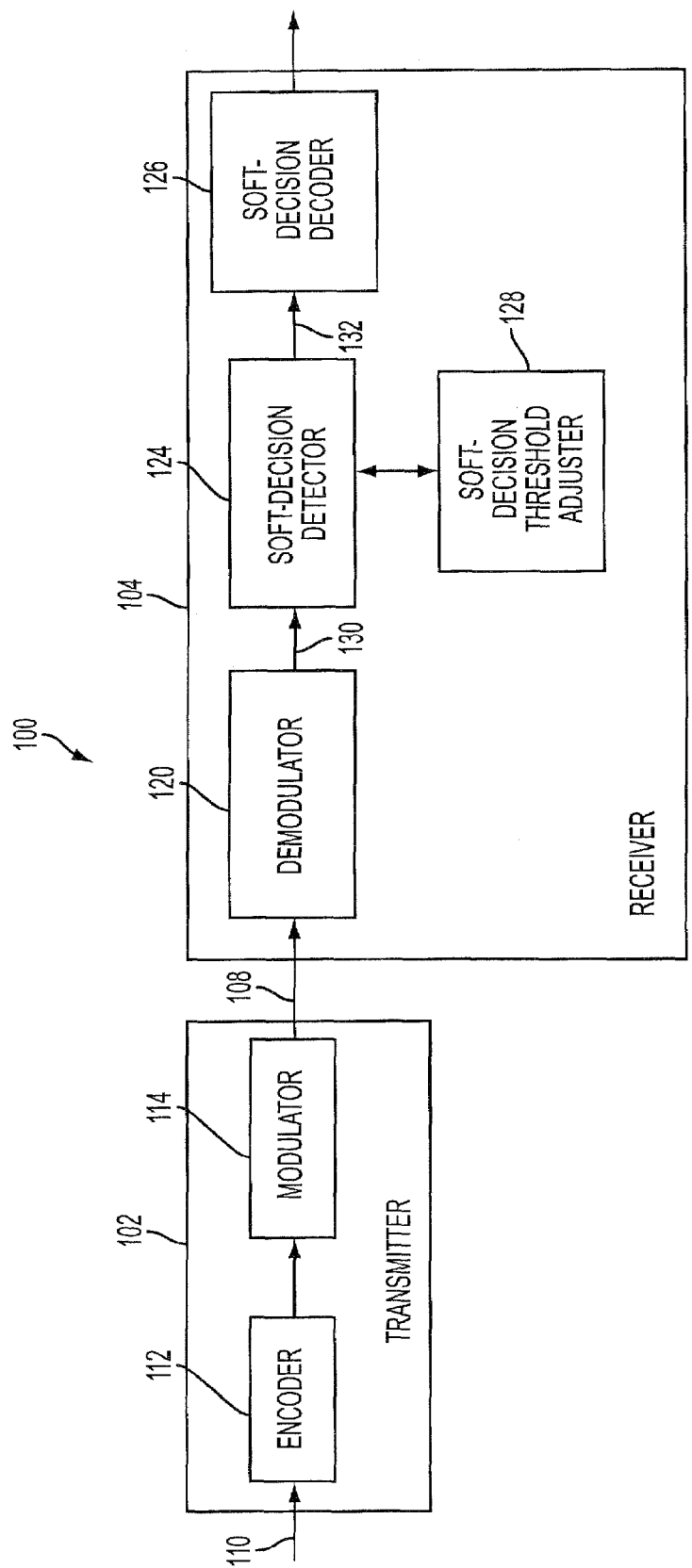
FIG. 1 is a schematic block diagram of an optical communications system including forward error correction (FEC) with soft-decision threshold adjustment, consistent with one embodiment of the present invention.

FIG. 1 shows an optical communication system 100 using forward error correction (FEC) with soft decision decoding and decision threshold adjustment, consistent with one embodiment of the present invention. The decision threshold adjustment is capable of optimizing decision thresholds by maximizing the mutual information of a received signal, as will be described in greater detail below. Although the exemplary embodiments are described in the context of an optical system, the broad concepts discussed herein may be implemented in other communications systems transmitting and receiving other types of signals.

The optical communication system 100 may include a transmitter 102 for transmitting an encoded optical signal 108 and a receiver 104 for receiving the encoded optical signal 108. Those of ordinary skill in the art will recognize that the depicted system is highly simplified for ease of explanation. For example, the transmitter 102 and the receiver 104 may be configured as one or more transceivers capable of performing both transmitting and receiving functions. The illustrated embodiments herein are provided only by way of explanation, not of limitation.

The transmitter 102 may include an encoder 112 that encodes a data stream 110 with error correction data and a modulator 114 that modulates an optical signal with the encoded data stream. The data stream 110 may be a binary data stream including a series of bits. The encoder 112 may be implemented using FEC schemes and equipment known to those skilled in the art, such as a turbo product code (TPC) scheme and TPC encoder. The modulator 114 may be implemented using optical modulation techniques and equipment known to those skilled in the art.

The receiver 104 may include a demodulator 120, a soft-decision detector 124, a soft-decision decoder 126, and a soft decision threshold adjuster 128. The demodulator 120 demodulates the modulated FEC encoded optical signal 108 and may be implemented using techniques and equipment known to those skilled in the art. The soft-decision detector 124 detects and quantizes the demodulated encoded optical signal 130 using multiple decision thresholds to produce a detected multi-bit signal 132. The soft-decision detector 124 may be implemented using techniques and detection circuitry (e.g., optical/electrical converters and quantizers) known to those skilled in the art.

The detected multi-bit signal 132 includes multi-level "soft-decision" values corresponding to each of the bits in the original data stream 110. The soft-decision decoder 126 receives the detected multi-bit signal 132 and decodes the multi-bit signal 132 based on the FEC scheme used. If the decoder 126 is an n-bit decoder capable of receiving and decoding $2^n$ multi-level values, the soft decision detector 124 may use $2^n-1$ decision thresholds to produce the $2^n$ multi-level values. The soft-decision decoder 126 may be implemented using techniques (e.g., TPC decoder) and equipment (e.g., hardware and software) known to those skilled in the art.

The soft decision threshold adjuster 128 adjusts the multiple decision thresholds, for example, to optimize the decision thresholds such that error correction is improved. In general, the soft decision threshold adjuster 128 may optimize the decision thresholds by maximizing mutual information of the transmitted and received signal. Mutual information, defined as a function of the transition probabilities in transmission systems, is a general measure of soft information conveyed in the detected multi-bit signals 132, as will be described in greater detail below. As used herein, "optimized" or "optimal" thresholds means threshold values that result in an improvement of the performance of the communication system as indicated, for example, by a lower bit error rate (BER). An "optimized" or "optimal" threshold does not necessarily need to result in the best theoretical performance. As used herein, "maximizing" mutual information means calculating a mutual information value that is at or near the highest possible mutual information value that may be calculated for a given signal under given conditions.

Numerous methods for adjusting decision thresholds using mutual information of the detected signal are described below. Those-skilled in the art will recognize that such methods may be implemented in the soft decision threshold adjuster 128 in a number of ways including software, hardware, or firmware. The soft decision threshold adjuster 128 may also be implemented separately from or integrated together with the soft-decision detector 124.

Before describing the exemplary methods for optimizing decision thresholds, the concept of mutual information and its relationship to decision thresholds is described in general. For a communication system with transmitted signal X and received signal Y, the mutual information is defined as $I(X, Y)=H(X)-H(X|Y)$, where $H(X)$ is the entropy of the transmitted signal and $H(X|Y)$ is the conditional entropy of the transmitted signal given the received signal. $H(X)$ may be interpreted as the amount of uncertainty about the transmitted signal, and $H(X|Y)$ as the remaining uncertainty about the transmitted signal after observing the received signal. Hence, $I(X, Y)$ represents the uncertainty about the transmitted signal resolved by observing the received signal. Since the goal of information processing including FEC is to resolve as much as possible the uncertainty about the transmitted signal, the decision thresholds on the input to a soft-decision FEC decoder may be optimized by maximizing the mutual information $I(X, Y)$.

For a n-bit-decision memoryless channel with independent equally-likely transmitted signals "0" and "1", i.e. $P(X=0)=P(X=1)=\frac{1}{2}$, the average mutual information of each pair of X and Y is $$I(X, Y) = \frac{1}{2} \sum_{X=0}^{1} \sum_{i=1}^{2^n} \left[ p(y_1 | X) \log_2 \frac{p(y_i | X)}{p(y_i)} \right], \quad (1)$$

where the quantized received signal Y takes value in the set $\{y_i, i=1, 2, \ldots, 2^n\}$ with the probabilities $P(Y=y_i)=p(y_i)$, $p(y_i|X=0, 1)$ are the transition probabilities of the channel. In general, transition probabilities represent the probability of a signal transitioning from one state to another in a channel. Given the conditional probability density functions (PDF) of the received analog signal y, $pdf_0(y)$ and $pdf_1(y)$ for $X=0$ and $X=1$, respectively, and let $L_{i-1}$ and $L_i$ be the decision thresholds that determine $y_i$, i.e. $Y=y_i$ if $L_{i-1} \leq y < L_i$, the mutual information $I(X, Y)$ may be expressed as a function of the decision thresholds, $$I(X, Y) = \frac{1}{2} \sum_{X=0}^{1} \sum_{i=1}^{2^n} \quad (2)$$

$$\left\{ \int_{L_{i-1}}^{L_i} p_X(y) dy \log_2 \frac{2\int_{L_{i-1}}^{L_i} p_X(y) dy}{\int_{L_{i-1}}^{L_i} [p_0(y) + p_1(y)] dy} \right\},$$

where $L_{i-1} = -\infty$ for $i=1$ and $L_i = \infty$ for $i=2^n$. The necessary conditions on the decision thresholds for maximum mutual information can be obtained by differentiating $I(X, Y)$ with respect to $\{L_i, i=1, 2, \ldots, 2^n-1\}$, which results in the following equations $$\frac{p_0(L_i)}{p_1(L_i)} = \frac{\log_2 \frac{p(y_i)p(y_{i+1} | X = 1)}{p(y_{i+1})p(y_i | X = 1)}}{\log_2 \frac{p(y_{i+1})p(y_i | X = 0)}{p(y_i)p(y_{i+1} | X = 0)}}, i = 1, 2, \ldots, 2^n - 1 \quad (3)$$

Note that on the right side of Eq. (3), $p(y_i)$ and $p(y_i|X)$ are functions of $L_{i-1}$ and $L_i$, $p(y_{i+1})$ and $p(y_{i+1}|X)$ are functions of $L_i$ and $L_{i+1}$. This indicates that not all thresholds are independent in maximizing mutual information and hence all thresholds may not be simply evaluated separately. It becomes complex, however, to evaluate all the optimal thresholds together by solving Eq. (3) for larger n. Eq. (3) implies that for fixed $L_{i-1}$ and $L_{i+1}$ the optimal position of $L_i$ can be evaluated independent from other thresholds. Based on this observation, a recursive algorithm may be used for selecting thresholds $\{L_i, i=1, 2, \ldots, 2^n-1\}$ for an n-bit soft decision detector, as will be described in greater detail below.

In the illustrated embodiment, the soft decision threshold adjuster 128 may adjust the multiple decision thresholds in the soft-decision detector 124 to maximize the mutual information of the detected multi-bit signal 132, which equivalently optimizes the decision thresholds for the soft-decision FEC decoding performance. The thresholds may be adjusted by maximizing the mutual information according to a number of different methods described in greater detail below.

The concept of optimizing decision thresholds by maximizing mutual information may be applied to the hard decision case for a binary symmetric channel (BSC). In a BSC with equal priori probability, for example, the mutual information $I(X, Y)$, detection error probability $p_d$, and the decision threshold $L$ are related by $I(X, Y) = 1 - H_2(p_d(L))$. If $p_d \in [0, 0.5]$, and $H_2(x)$ is monotonically increasing in $[0, 0.5]$, the maximum $I(X, Y)$ and the minimum $p_d$ correspond to the same optimal L.

Figure 2:
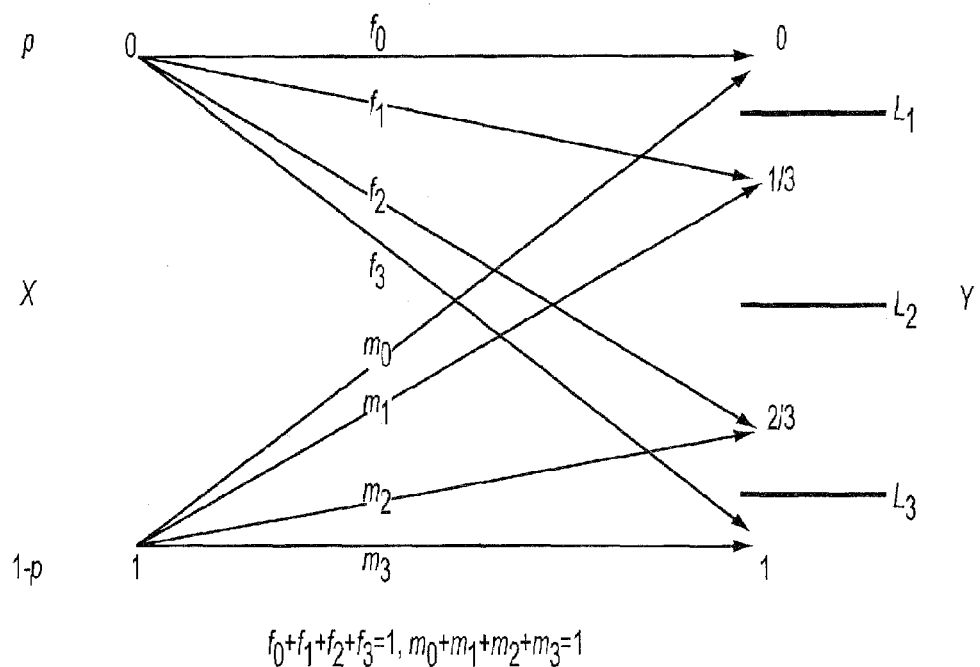
FIG. 2 is a diagram illustrating decision thresholds and transition probabilities in a binary channel with a 2-bit decision receiver.

According to one example, the decision thresholds for a 2-bit soft decision detector may be optimized recursively. The model of a binary channel with 2-bit soft decision detection is shown in FIG. 2. For 2-bit soft decision, there are three (3) decision thresholds, $L_1$, $L_2$, $L_3$ and transition probabilities $f_0, f_1, f_2, f_3, m_0, m_1, m_2, m_3$.

According to a recursive algorithm, the middle threshold $L_2$ may be set first at the same position of the optimal threshold for a hard decision (or 1-bit decision) case and then the optimal positions of the remaining thresholds $L_1$ and $L_3$ may be evaluated separately. For 2-bit soft decision, the mutual information can be evaluated as a function of the transition probabilities by $$I(X, Y) = \sum_{i=0}^{3} \{H[pf_i + (1-p)m_i] - pH(f_i) - (1-p)H(m_i)\} \quad (4)$$

where $H(x) = -x \log_2(x)$.

Eq. (4) can be rewritten as $$I(X, Y) = \sum_{i=0}^{1} \{H[pf_i + (1-p)m_i] - pH(f_i) - (1-p)H(m_i)\} + \sum_{i=2}^{3} \{H[pf_i + (1-p)m_i] - pH(f_i) - (1-p)H(m_i)\} \quad (5)$$

For fixed $L_2$, the transition probabilities $f_0, f_1, m_0, m_1$ depend only on $L_1$ and $f_2, f_3, m_2, m_3$ depend only on $L_3$, thus with Eq. (5) we have $$I(X, Y) = I_1(L_1) + I_3(L_3) \text{ where} \quad (6)$$

$$I_1(L_1) = \sum_{i=0}^{1} \{H[pf_i(L_1) + (1-p)m_i(L_1)] - pH[f_i(L_1)] - (1-p)H[m_i(L_1)]\}$$

$$I_3(L_3) = \sum_{i=2}^{3} \{H[pf_i(L_3) + (1-p)m_i(L_3)] - pH[f_i(L_3)] - (1-p)H[m_i(L_3)]\}$$

$L_1$ and $L_3$ are two independent arguments of $I(X, Y)$. The optimal values of $L_1$ and $L_3$ maximizing $I(X, Y)$ may be evaluated separately by $$\left. \frac{d(I_1(L_1))}{dL_1} \right|_{L_1 = L_{1opt}} = 0 \quad (7)$$

$$\left. \frac{d(I_3(L_3))}{dL_3} \right|_{L_3 = L_{3opt}} = 0 \quad (8)$$

Figure 3A:
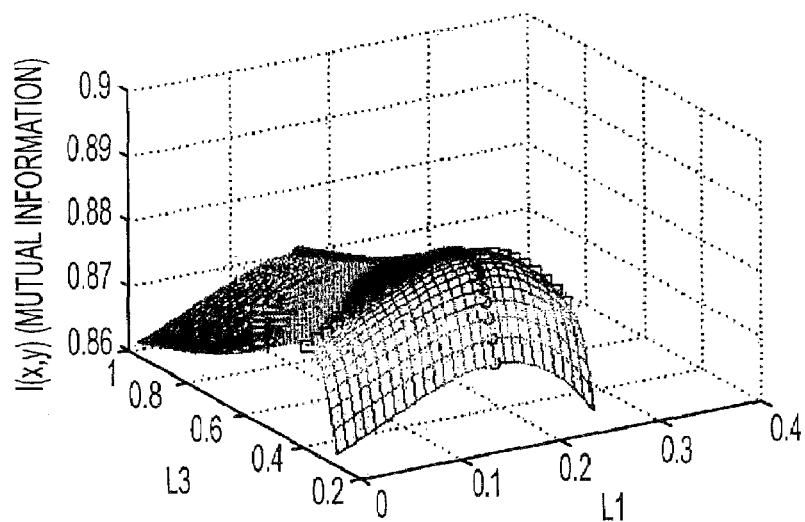
FIGS. 3A-3D are graphs illustrating an evaluation of the mutual information as a function of the decision thresholds $L_1$ and $L_3$ in 2-bit decision detection.
Figure 4:
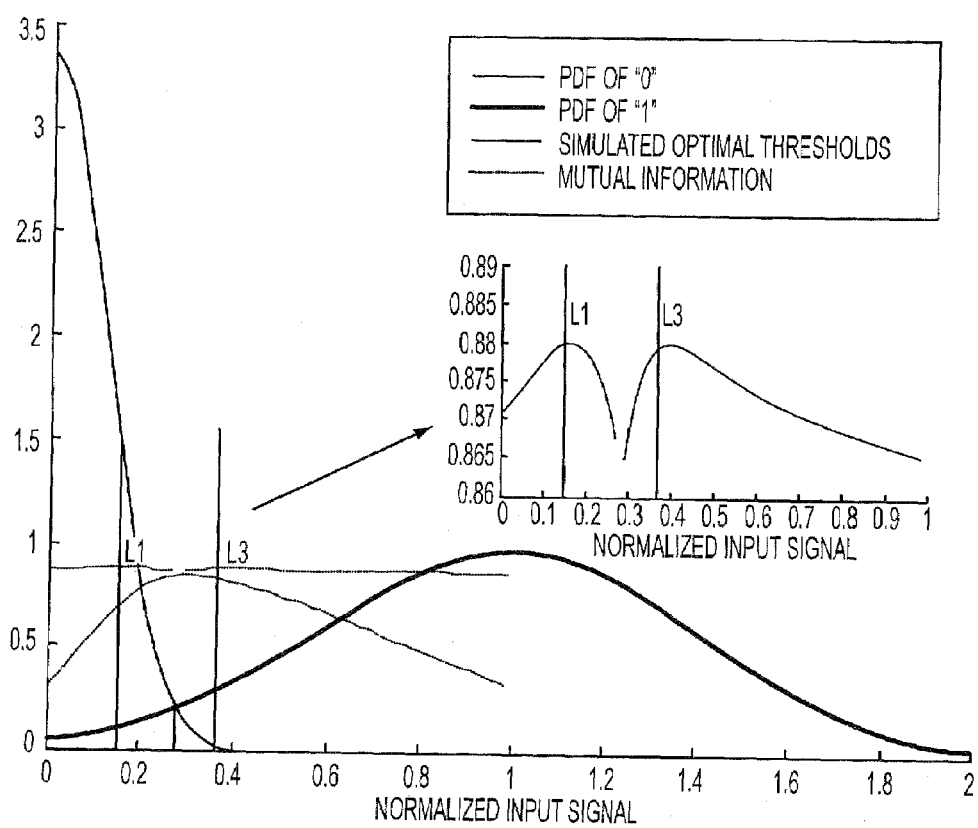
FIG. 4 is a graph illustrating optimal thresholds in simulations and theoretical mutual information.

In an optical fiber channel assuming asymmetric Gaussian model, we have $$\sigma_0 = \frac{\sqrt{\frac{B_o}{B_e}}}{Q(\sigma_0 + \sigma_1)} \quad (9)$$

$$\sigma_1 = \frac{\sqrt{4Q\sigma_0\left(1 + \frac{Q}{\sigma_0}\right) + \frac{B_o}{B_e}}}{Q(\sigma_0 + \sigma_1)} \quad (10)$$

thus, $f_1 = \text{normcdf}(L_2, 0, \sigma_0) - \text{normcdf}(L_1, 0, \sigma_0)$
$f_2 = \text{normcdf}(L_3, 0, \sigma_0) - \text{normcdf}(L_2, 0, \sigma_0)$
$f_3 = 1 - \text{normcdf}(L_3, 0, \sigma_0)$
$m_0 = \text{normcdf}(L_1, 1, \sigma_1)$
$m_1 = \text{normcdf}(L_2, 1, \sigma_1) - \text{normcdf}(L_1, 1, \sigma_1)$
$m_2 = \text{normcdf}(L_3, 1, \sigma_1) - \text{normcdf}(L_2, 1, \sigma_1)$ FIG. 3A shows the surface of the mutual information I(X, Y) plotted as a function of $L_1$ and $L_3$, for $p=\frac{1}{2}$, i.e. equal-probably transmitted 0 and 1. The maximum of the surface corresponds to optimal threshold settings at $Q^2=5.6$ dB. The illustrated threshold settings are consistent with TPC simulation results shown in FIG. 4. In FIG. 4, the three (3) threshold levels shown (vertical lines) correspond to the optimal settings achieving minimum output BER for a 2-bit soft-decision receiver, and the three dashed curves from left to right correspond to the mutual information $I(L_1)_{L2=L2opt,\ L3=L3opt}$, $I(L_2)_{hard\ decision}$, $I(L_3)_{L1=L1opt,\ L2=L2opt}$ respectively.

Figure 3B:
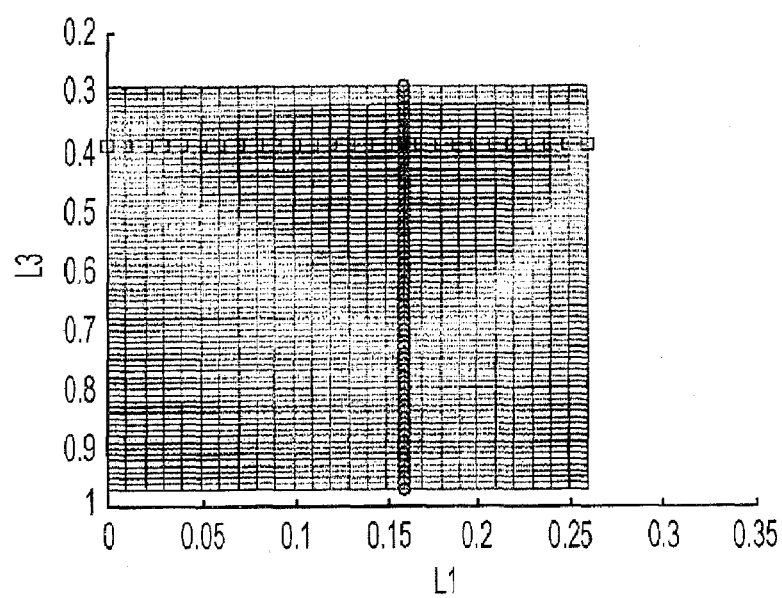
Figure 3C:
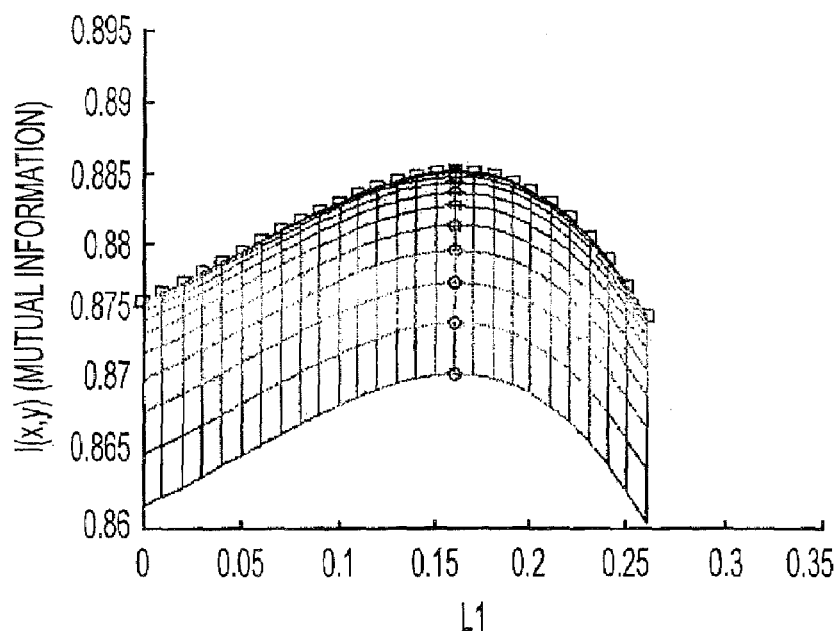
Figure 3D:
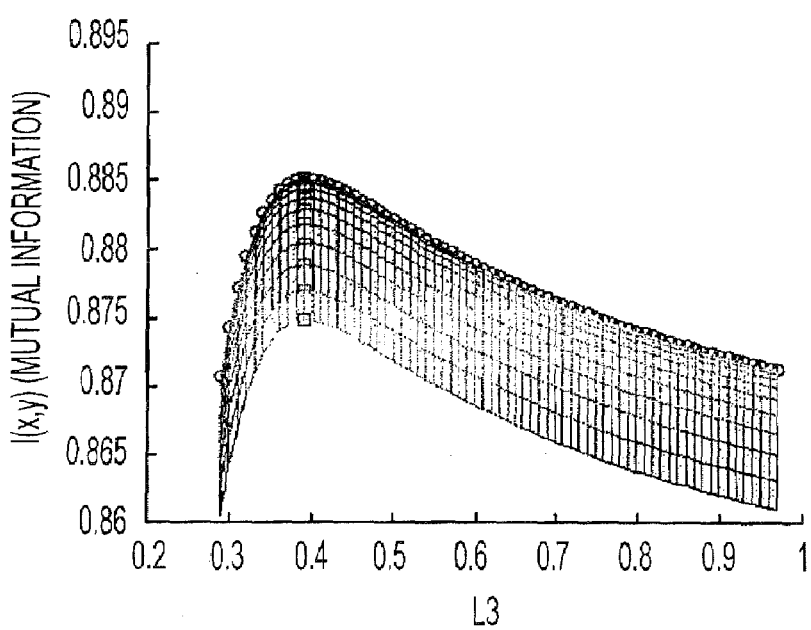
Figure 5:
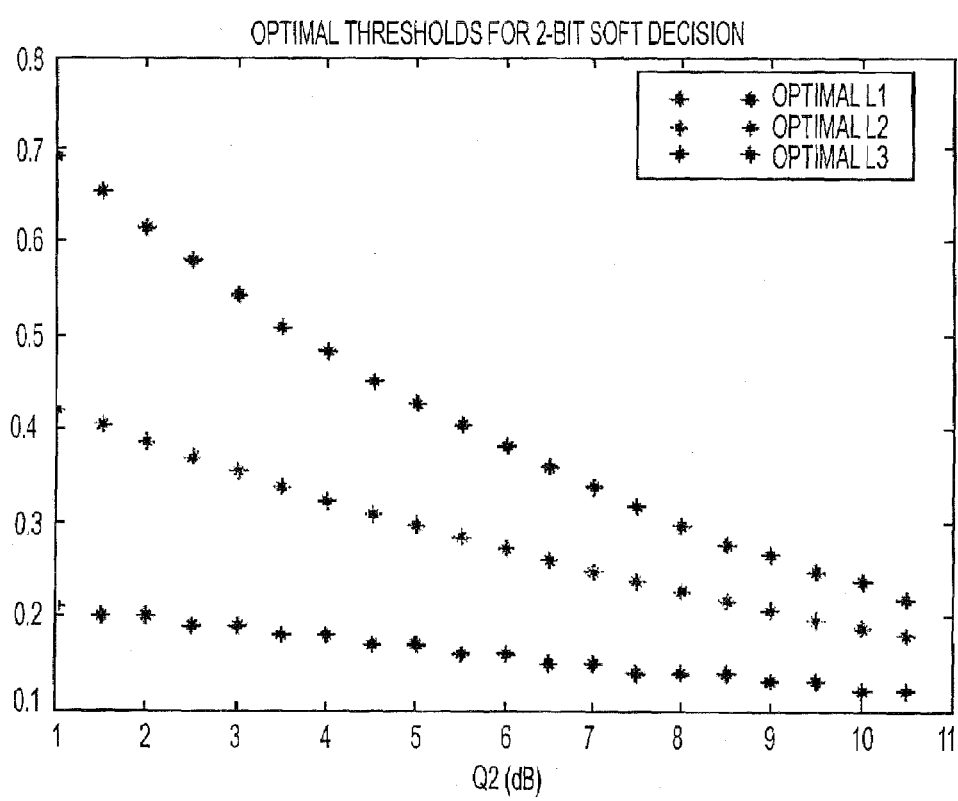
FIG. 5 is a graph illustrating predicted optimal thresholds for 2-bit soft decision detection by maximizing mutual information for different Q factors.

FIGS. 3B-3D plot projections of FIG. 3A onto single planes along the three axes, I(X, Y), $L_3$, and $L_1$ respectively. FIGS. 3B-3D show that $L_1$ (lowest of the 3 thresholds) and $L_3$ (highest of the 3 thresholds) are independent arguments of I(X, Y). FIG. 5 plots the theoretical prediction of the optimal thresholds for 2 bit soft decision by maximizing mutual information for different Q factors.

The method of optimizing decision thresholds by maximizing mutual information of a detected signal may also be extended to a general binary channel with n-bit soft decision detection. In the 2-bit case, the recursive optimization involved first evaluating $L_2$ in a 1-bit decision, and then fixing $L_2$ and evaluating $L_1$ and $L_3$ separately. In n-bit soft decision, recursive optimization involves evaluating the optimal thresholds for n-bit decision based on the optimal thresholds obtained for the previous n-1-bit case. If the $2^{n-1}-1$ optimal thresholds are obtained for the n-1-bit decision which divide the range of the received signal into $2^{n-1}$ intervals, to get the thresholds for the n-bit decision, new thresholds are added in each interval. The $2^{n-1}$ new thresholds are independent to each other in maximizing mutual information.

Figure 6:
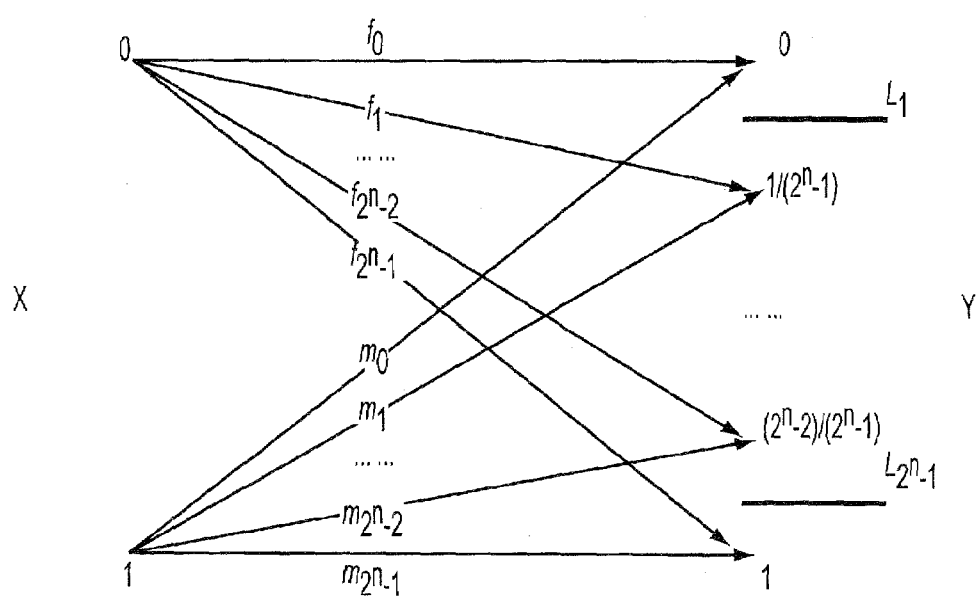
FIG. 6 is a diagram illustrating decision thresholds and transition probabilities in a binary channel with an n-bit decision receiver.
Figure 7A:
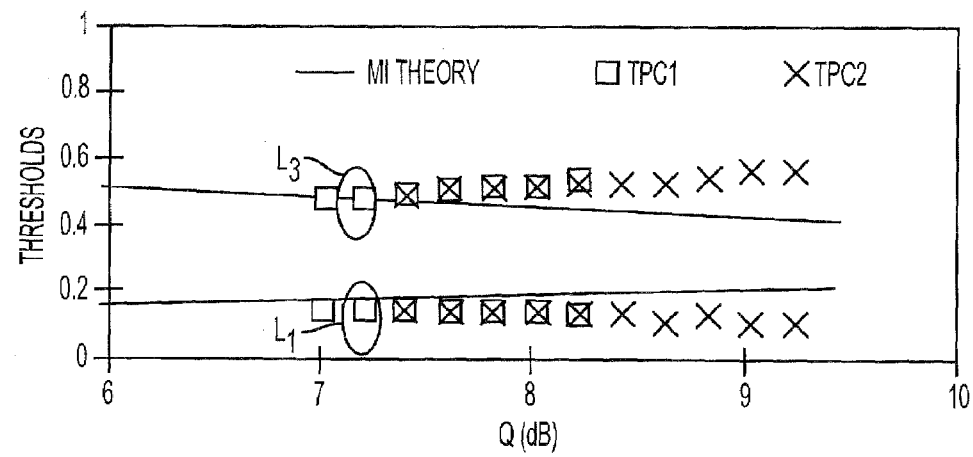
FIGS. 7A and 7B are graphs illustrating optimal thresholds and TPC performance, respectively, for simulations using a chi-square model to model fiber optic channels.
Figure 7B:
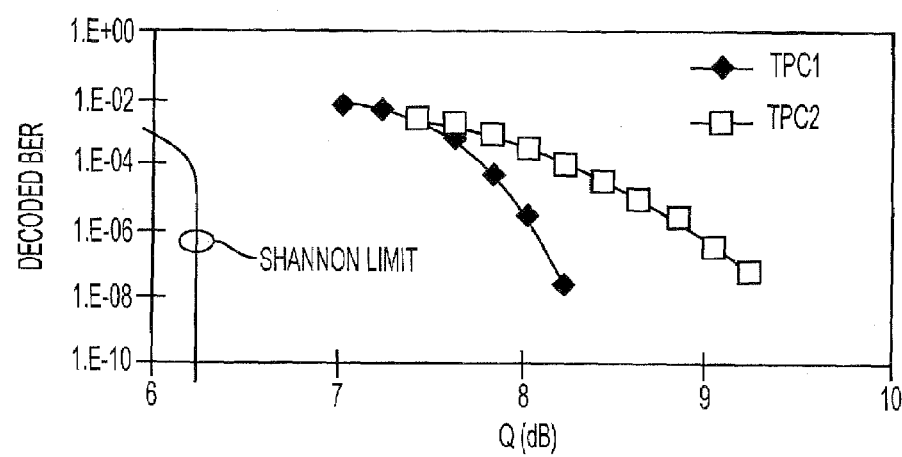

FIG. 6 illustrates a model of a binary channel with n-bit soft decision detection. For the n-bit decision, $2^n-1$ thresholds—$L_1, L_2, \ldots, L_{2^n-1}$ correspond to the normalized signal with amplitude within [0, 1]. As mentioned above, the thresholds are set in such a way that $L_2, L_4, \ldots, L_{2^n-2}$ correspond to the optimal thresholds for n-1-bit decision and $L_1, L_3, \ldots, L_{2^n-1}$ correspond to the new added thresholds. The mutual information I(X, Y) is related to the thresholds via the transition probabilities shown in FIG. 6. I(X, Y) can be expressed as a function of the transition probabilities by $$I(X, Y) = \sum_{i=0}^{2^n-1} \{H[pf_i + (1-p)m_i] - pH(f_i) - (1-p)H(m_i)\} \quad (11)$$

The transition probabilities are functions of the thresholds as shown below.

$f_0 = \text{normcdf}(L_1, 0, \sigma_0)$
$f_1 = \text{normcdf}(L_2, 0, \sigma_0) - \text{normcdf}(L_1, 0, \sigma_0)$
$f_2 = \text{normcdf}(L_3, 0, \sigma_0) - \text{normcdf}(L_2, 0, \sigma_0)$
$f_3 = \text{normcdf}(L_4, 0, \sigma_0) - \text{normcdf}(L_3, 0, \sigma_0)$
. . .
$f_{2^n-2} = \text{normcdf}(L_{2^n-1}, 0, \sigma_0) - \text{normcdf}(L_{2^n-2}, 0, \sigma_0)$
$f_{2^n-1} = 1 - \text{normcdf}(L_{2^n-2}, 0, \sigma_0)$
$m_0 = \text{normcdf}(L_1, 1, \sigma_1)$
$m_1 = \text{normcdf}(L_2, 1, \sigma_1) - \text{normcdf}(L_1, 1, \sigma_1)$
$m_2 = \text{normcdf}(L_3, 1, \sigma_1) - \text{normcdf}(L_2, 1, \sigma_1)$
$m_3 = \text{normcdf}(L_4, 1, \sigma_1) - \text{normcdf}(L_3, 1, \sigma_1)$
. . .
$m_{2^n-2} = \text{normcdf}(L_{2^n-1}, 0, \sigma_1) - \text{normcdf}(L_{2^n-2}, 0, \sigma_1)$
$m_{2^n-1} = 1 - \text{normcdf}(L_{2^n-2}, 0, \sigma_1)$ From these formulae, given the thresholds $L_2, L_4, \ldots, L_{2^n-2}$, the transition probabilities $m_{i-1}, m_i, f_{i-1}, f_i$ depend only on $L_i$ for all $i=1, 3, \ldots, 2n-1$. Also note that $m_{i-1}, m_i, f_{i-1}, f_i$ and $m_{j-1}, m_j, f_{j-1}, f_j$ are two independent sets of transition probabilities as long as $i \neq j$ for all $i,j=1, 3, \ldots, 2n-1$. Hence, $L_i$ and $L_j$ are independent arguments of I(X, Y) for all $i \neq j$ and $i,j=1, 3, \ldots, 2n-1$. Thus the optimal value of the new added thresholds can be evaluated by $$\left.\frac{d(I_i(L_i))}{dL_i}\right|_{L_i=L_{iopt}} = 0 \text{ where} \quad (12)$$

$$I_i(L_i) = \sum_{q=i-1}^{i} \{H[pf_q(L_i) + (1-p)m_q(L_i)] - pH[f_q(L_i)] - (1-p)H[m_q(L_i)]\}$$

$$i = 1, 3, \ldots, 2n-1.$$

According to another example, a recursive algorithm may be used with 3-bit (n=3) soft decision detection. According to this method, the threshold $L_4$ may be first optimized (e.g., using Eq. (3) or Eq. (12)) for hard decision (i.e., n=1). The two (2) thresholds $L_2$ and $L_6$ may then be independently optimized (e.g., with Eq. (3) or Eq. (12)) for 2-bit decision (i.e., n=2). The four (4) thresholds $L_1, L_3, L_5,$ and $L_7$ may then be independently optimized with Eq. (3) or Eq. (12) for 3-bit soft decision (i.e., n=3). For the n>3 cases, the algorithm can be similarly obtained with more recursions.

The above recursive algorithm can simplify the multi-threshold optimization process for n-bit decision detection with an assumption that, for a given noise distribution, the optimal thresholds for a (n−1)-bit decision are also optimal for an n-bit decision. Numerical evaluations on 2-bit and 3-bit decision with additive white Gaussian noise (AWGN) have shown that the proposed algorithm results in thresholds very close to (if not exactly, given the limited numerical accuracy) the optimal thresholds.

Thresholds determined by the equations discussed above may be optimal in the sense of maximum mutual information when the transmitted bits are independent and the channel is memoryless. Optimal thresholds for FEC may also depend on and be specific for the FEC code employed, which is not and cannot be generalized in the equations discussed above. In general, FEC may correct errors by introducing correlation in the transmitted bits. Thus, the bits in a codeword are no longer independent. In a memoryless channel with transmitted codeword $X=(X_1, \ldots, X_n)$ and received noisy codeword $Y=(Y_1, \ldots, Y_n)$, the mutual information I(X, Y) is upper bounded by the sum of $I(X_i, Y_i)$ over $i=1, \ldots, n$. In memoryless channels, the codeword-based mutual information I(X, Y) may not exceed the mutual information maximized by the above equations. Moreover, the mutual information at the output of an FEC decoder is upper bounded by the input mutual information i.e. I(X, Y). An FEC code can resolve as much uncertainty about the transmitted bits as the mutual information maximized by the above equations. When FEC code performance approaches the Shannon limit, the optimal decision thresholds converge to the thresholds satisfying the above equations, as shown in the simulations discussed below.

Unlike additive white Gaussian noise (AWGN) channels, fiber optic communication systems may have asymmetric noise distributions due to the square-law detection of the photodetectors. The asymmetry of the noise distributions refers to the fact that the received spaces and marks have different variances and probability density functions (PDFs). For noise-limited fiber optic channels, in which the amplified spontaneous emission noise dominates other impairments, the PDFs of the received spaces and marks, i.e. $pdf_0(y)$ and $pdf_1(y)$, can be approximated with chi-square distributions.

Modeling fiber optic channels with the chi-square model and using the proposed recursive algorithm, the optimal thresholds may be evaluated using the method describe above for 2-bit soft decision at different Q-factors. The Q-factor is defined by $Q=\sqrt{2}erfc^{-1}(2p_e)$, where $p_e$ is the uncorrected bit error rate (BER) and $erfc^{-1}(x)$ is the inverse complementary error function. In this example, simulations were performed on two TPCs, TPC1(128, 120)(128, 126) and TPC2(116, 108)(116,115) which have similar overhead around 8.35%.

Figure 8A:
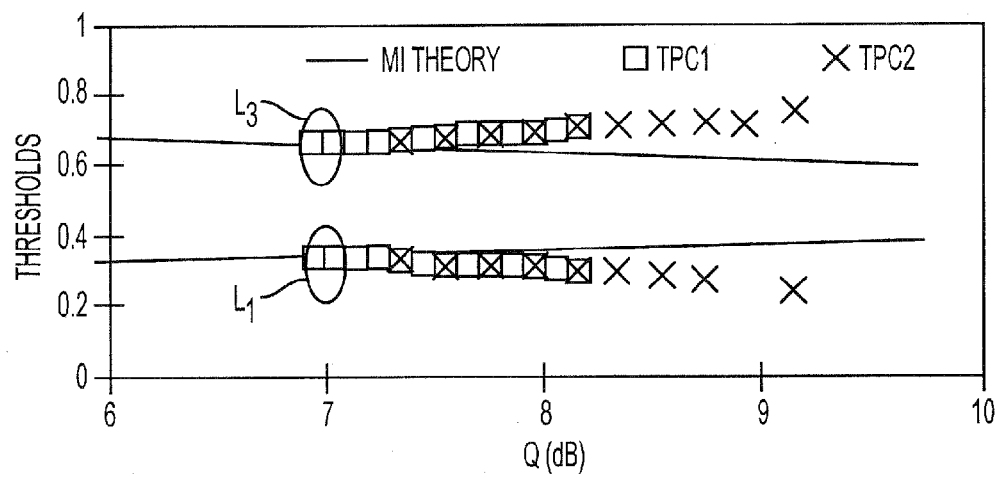
FIGS. 8A and 8B are graphs illustrating optimal thresholds and TPC performance, respectively, for simulations based on an additive white Gaussian noise (AWGN) model.
Figure 8B:
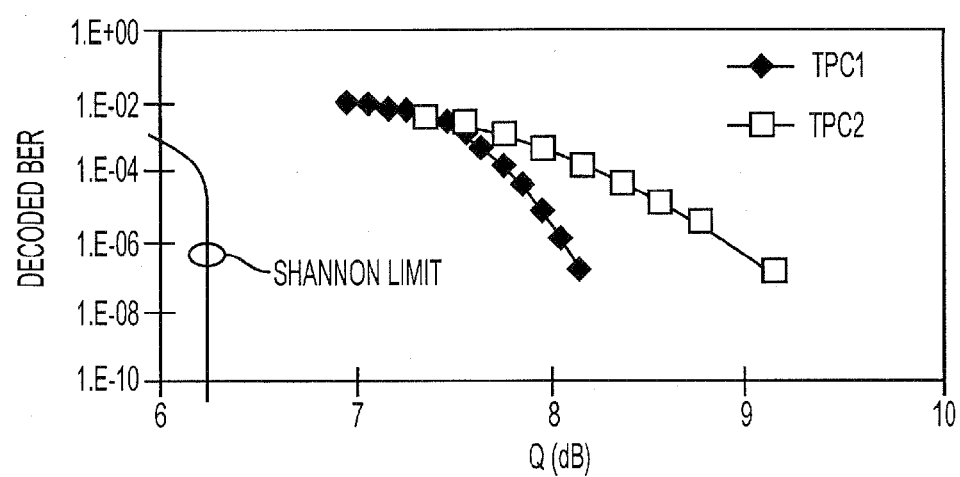

For hard-decision AWGN channels, it can be proved based on the above equations that maximizing mutual information is equivalent to minimizing decision error probability. In the chi-square channels, the optimal hard-decision threshold by maximizing mutual information is very close to (if not exactly, given the limited numerical accuracy) the one giving minimum decision error probability. Therefore, in both theoretical evaluations and simulations the central threshold $L_2$ may be set to where minimum hard-decision error probability is achieved. In the simulations, optimal $L_1$ and $L_3$ (assuming $0 \leq L_1 < L_2 < L_3 \leq 1$) giving the best FEC performance are found by a two-dimensional sweep with a 0.01 step size on each threshold, where the means of the spaces and marks are normalized to 0 and 1, respectively. The sweep is performed over about 2000 possible threshold combinations for the 2-bit-decision fiber optic channels for the purpose of comparison with the maximized mutual information results. For more thresholds, however, the sweep method may not be practical because the number of possible threshold combinations becomes prohibitively large. FIGS. 8A and 8B show the results based on the chi-square model and the results based on the AWGN model are plotted in FIGS. 9A and 9B for comparison.

For each of the two codes, as shown in FIG. 8A, as Q-factor decreases the optimal FEC thresholds converge to the thresholds optimized by maximizing mutual information. At lower Q-factor, the code performance gets closer to the Shannon limit as seen in FIG. 8B. Comparing the performance and optimal thresholds of the two TPCs, for the same target decoded BER, the optimal thresholds of TPC1 are better approximated with the thresholds optimized by maximizing mutual information. This is because the stronger code can operate at a lower Q-factor for the same target decoded BER. If the thresholds are set by maximizing mutual information, the Q-factor penalty is around 0.9 dB and 0.2 dB for the weaker TPC and the stronger TPC, respectively, at a $10^{-7}$ BER. These comparisons show that the optimal FEC thresholds are functions of both the mutual information and the FEC code. Also, as the FEC performance approaches the Shannon limit, the optimal thresholds for FEC converges to the thresholds optimized by maximizing mutual information. Although maximizing mutual information may not give the exact optimal thresholds for specific FEC codes, it may give useful initial values that can speed up the multi-threshold optimization procedure for soft-decision FEC decoding.

Figure 9:
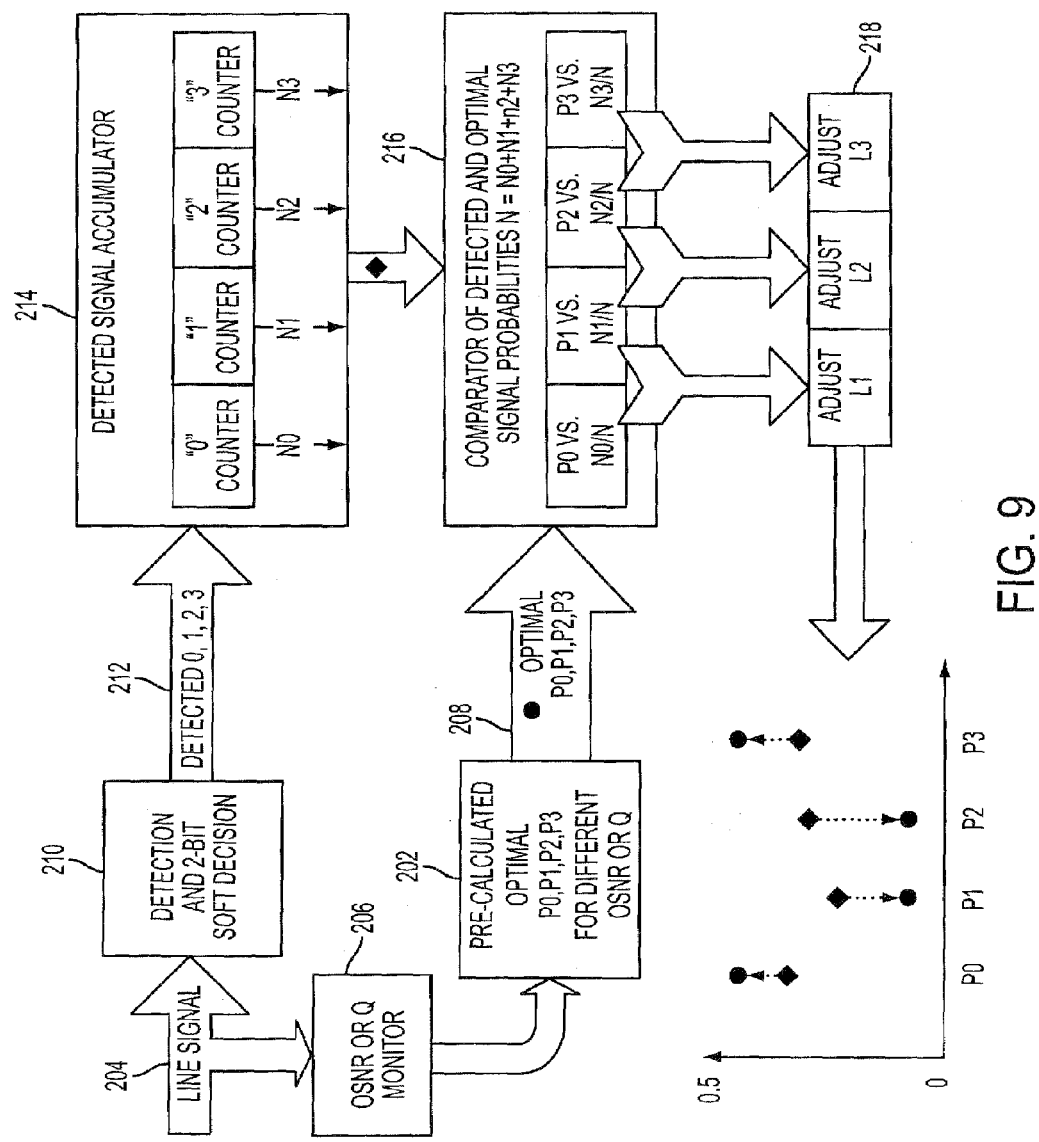
FIG. 9 is a block flow diagram of one embodiment of a system and method for adjusting a soft-decision threshold.

According to other methods, soft decision thresholds may be optimized by maximizing mutual information using adaptive schemes. FIG. 9 illustrates one such threshold adjustment method for systems with pre-knowledge on noise distribution. If the probability density function of the channel noise is known for a given optical signal-to-noise ratio (OSNR) or Q-factor, for example, optimal thresholds may be pre-calculated. Each set of pre-calculated optimal thresholds corresponds to a set of detected signal probabilities. In general, signal probabilities represent the probability that a signal has a particular value. For 2-bit soft decision, for example, there are three (3) thresholds L1, L2, L3 and four soft signal probabilities denoted by P0, P1, P2, and P3.

In the illustrated method, optimal values for the signal probabilities P0-P3 202 for different noise distribution information (e.g., OSNR or Q) may be pre-calculated and stored, for example, in a lookup table in receiver memory. The line signal 204 may be monitored to determine the noise distribution, for example, using an OSNR or Q monitor 206 as is known to those skilled in the art. The monitored noise distribution is compared to the stored noise distribution information (e.g. in the lookup table). Based on this comparison, optimal signal probabilities (e.g., P0, P1, P2, P3) 208 corresponding to the monitored noise distribution are selected.

The line signal 204 is detected, for example, using a 2-bit soft decision detector 210, to produce a detected multi-bit signal 212 including multi-level values (0, 1, 2, 3). The probabilities of the detected signal after the 2-bit soft decision detection may be obtained by accumulation, for example, using a detected signal accumulator 214. The accumulated real signal probabilities for the detected signal 212 are compared against the selected pre-stored optimal signal probabilities 208 corresponding to the monitored noise distribution, for example, using a comparator 216. This comparison may be used to determine threshold adjustments 218 that will cause the detected signal probabilities, and thus the thresholds, to approach the optimal values.

Although the illustrated embodiment shows one implementation, those skilled in the art will recognize that this method of adjusting thresholds may also be implemented in other ways, for example, using various types of hardware, software, firmware or combinations thereof. This method may also be used in n-bit soft decision systems where n>2.

Figure 10:
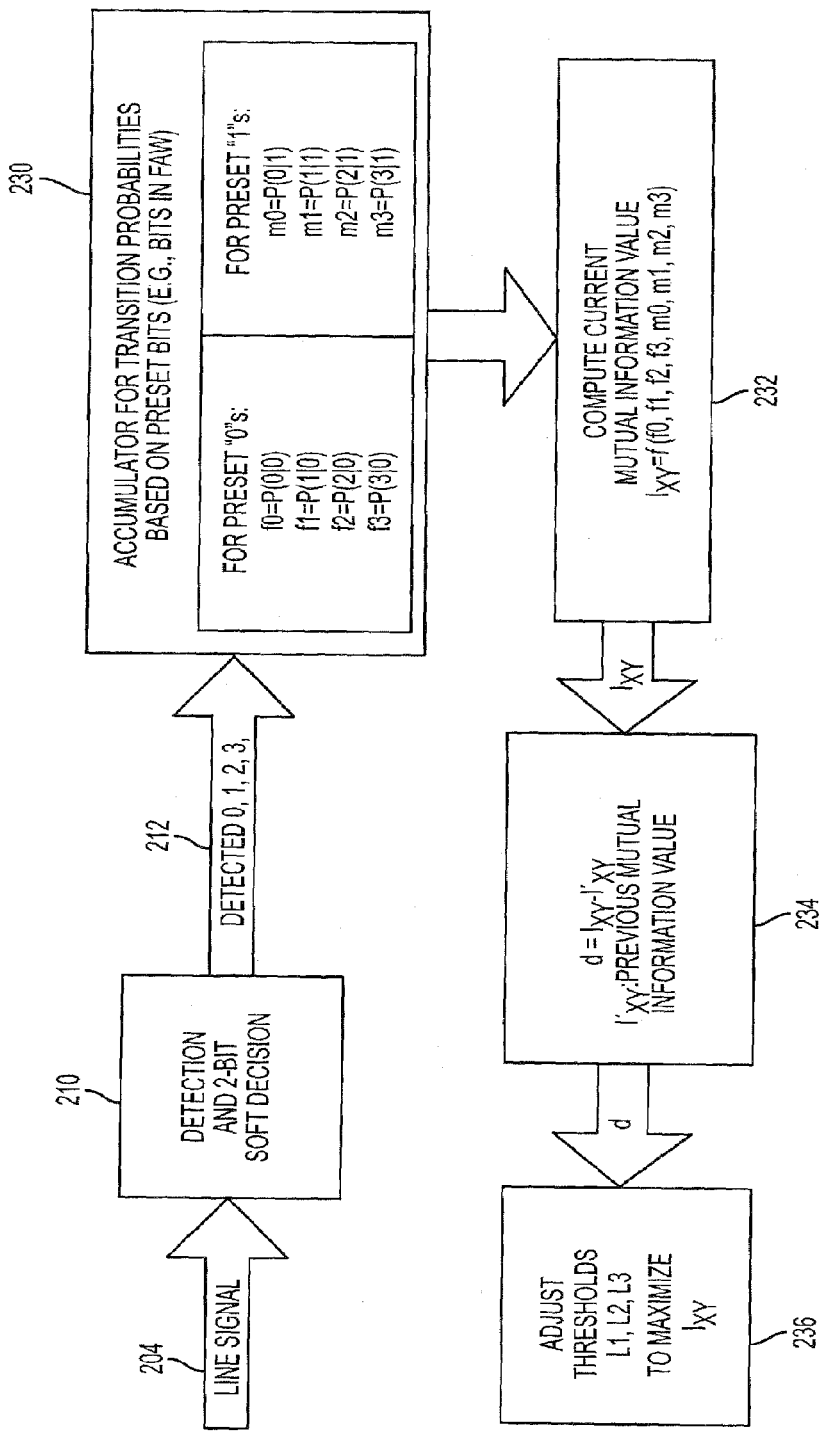
FIG. 10 is a block flow diagram of another embodiment of a system and method for adjusting a soft-decision threshold.

FIG. 10 illustrates another adaptive threshold adjustment method for systems without pre-knowledge on noise distribution. A line signal 204 is detected, for example, using a 2-bit soft decision detector 210 to produce a detected multi-bit signal 212 including multi-level values (0, 1, 2, 3). If there is no pre-knowledge on the channel noise distribution, the signal transition probabilities may be obtained by accumulating the detected soft signal values for some preset bits, for example, using an accumulator 230. As mentioned above, transition probabilities represent the probability of a signal transitioning from one state to another in a channel. In one embodiment, the preset bits may be bits in frame alignment words (FAW).

With the accumulated transition probabilities (f0, f1, f2, f3, m0, m1, m2, m3), a mutual information value $I_{XY}$ may be calculated 232. A change d in the mutual information value $I_{XY}$ from a previous mutual information value $I'_{XY}$ may then be calculated 234 and used to adjust the thresholds L1, L2, L3 236 such that the mutual information $I_{XY}$ is maximized.

Those skilled in the art will recognize that the calculations of $I_{XY}$ and d may be performed using hardware, software, firmware, or any combinations thereof.

By adjusting the thresholds to change the transition probabilities, the optimal thresholds corresponding to the maximum mutual information may be found. As an example of accumulating time for good statistics, an FEC code has a 24-bit FAW for each 10.6 μs FEC frame. Thus, about 24 Mbits may be accumulated in each 10 second period of time.

In summary, a method consistent with the present invention obtains decision thresholds in a soft decision error correction system. The method includes receiving an encoded signal representing a binary data stream; detecting the encoded signal using a plurality of decision threshold values to obtain a detected multi-bit signal including multi-level values corresponding to each of the bits in the binary data stream; and adjusting the decision threshold values based on mutual information of the detected multi-bit signal.

According to one embodiment, the decision threshold values are optimized by maximizing the mutual information using a recursive algorithm, which evaluates groups of the threshold values separately.

According to another embodiment, the decision thresholds are adjusted by accumulating transition probability values corresponding to the multi-level values in the multi-bit signal; calculating a mutual information value based upon the accumulated transition probability values; calculating a change in mutual information from a previous mutual information value; and adjusting the decision threshold values based on the change in mutual information.

According to a further embodiment, the decision thresholds are adjusted by monitoring the encoded signal to obtain channel noise distribution information; obtaining predetermined soft signal probability values corresponding to the channel noise distribution information; accumulating soft signal probability values corresponding to the multi-level values in the detected multi-bit signal; comparing the accumulated soft signal probability values for the detected multi-bit signal to the predetermined soft signal probability values corresponding to the channel noise distribution to determine threshold adjustment values for each of the decision threshold values; and adjusting the decision threshold values based on the threshold adjustment values.

An optical receiver, consistent with one embodiment of the invention, includes a soft-decision detector for receiving an encoded optical signal representing a binary data stream and for detecting the encoded signal using a plurality of decision threshold values to obtain a detected multi-bit signal including multi-level values corresponding to each of the bits in the binary data stream. A soft decision threshold adjuster adjusts the decision threshold values based on mutual information of the detected multi-bit signal.

Accordingly, the decision thresholds in a soft decision detection system may be adjusted by maximizing the mutual information of a detected signal such that the decision thresholds are optimized.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A method for obtaining decision thresholds in a soft decision error correction system, said method comprising:
   receiving an encoded signal representing a binary data stream, wherein said encoded signal is an optical signal;
   detecting said encoded signal using a plurality of decision threshold values to obtain a detected multi-bit signal including multi-level values corresponding to each of the bits in said binary data stream; and
   adjusting said decision threshold values based on mutual information of said detected multi-bit signal.

2. The method of claim 1 wherein adjusting said decision threshold values comprises optimizing said decision threshold values by maximizing said mutual information of said detected multi-bit signal.

3. The method of claim 1 wherein said soft decision error correction system is a 2-bit system, wherein said plurality of decision threshold values includes three decision threshold values, and wherein said detected multi-bit signal includes four multi-level values.

4. The method of claim 3 wherein adjusting said decision threshold values comprises:
   setting a middle threshold value $L_2$ of said three decision values, wherein said middle threshold value is optimized using by maximizing said mutual information of said detected signal for a 1-bit decision; and
   setting upper and lower threshold values $L_1$, $L_3$ of said three decision values separately from said middle threshold value, wherein said upper and lower threshold values are optimized by maximizing said mutual information of said detected signal for a 2-bit decision.

5. The method of claim 1 wherein said soft decision error correction system is a n-bit system, wherein said plurality of decision thresholds includes $2^n-1$ decision thresholds $L_1$, $L_2$, . . . , $L_{2^n-1}$, wherein said detected multi-bit signal includes $2^n$ multi-level values, wherein adjusting said decision threshold values comprises optimizing said decision threshold values by maximizing said mutual information using a recursive algorithm, and wherein said recursive algorithm optimizes groups of said threshold values separately.

6. The method of claim 1 wherein said soft decision error correction system is a 3-bit system, wherein said plurality of decision threshold values includes seven decision threshold values, and wherein said detected multi-bit signal includes eight multi-level values, and wherein adjusting said decision threshold values comprises:
   setting a middle decision threshold value $L_4$ of said seven decision threshold values, wherein said middle threshold value is optimized using by maximizing said mutual information of said detected signal for a 1-bit decision;
   setting a first group of decision threshold values $L_2$, $L_6$ of said seven decision threshold values separately from said middle threshold value, wherein said first group of decision threshold values are optimized by maximizing said mutual information of said detected signal for a 2-bit decision; and
   setting a second group of decision threshold values $L_1$, $L_3$, $L_5$, and $L_7$ of said seven decision threshold values separately from said middle decision threshold value and said first group of decision threshold values, wherein said second group of decision threshold values are optimized by maximizing said mutual information of said detected signal for a 3-bit decision.

7. The method of claim 1 wherein adjusting said decision threshold values comprises:
  accumulating transition probability values corresponding to said multi-level values in said multi-bit signal;
  calculating a mutual information value based upon said accumulated transition probability values;
  calculating a change in mutual information from a previous mutual information value; and
  adjusting said decision threshold values based on said change in mutual information.

8. The method of claim 1 wherein adjusting said decision threshold values comprises:
  monitoring said encoded signal to obtain channel noise distribution information;
  obtaining predetermined soft signal probability values corresponding to said channel noise distribution information;
  accumulating soft signal probability values corresponding to said multi-level values in said detected multi-bit signal;
  comparing said accumulated soft signal probability values for said detected multi-bit signal to said predetermined soft signal probability values corresponding to said channel noise distribution to determine threshold adjustment values for each of said decision threshold values; and
  adjusting said decision threshold values based on said threshold adjustment values.

9. A method for obtaining decision thresholds in a soft decision error correction system, said method comprising:
  receiving an encoded signal representing a binary data stream;
  detecting said encoded signal using a plurality of decision threshold values to obtain a detected multi-bit signal including multi-level values corresponding to each of the bits in said binary data stream;
  accumulating transition probability values corresponding to said multi-level values in said multi-bit signal;
  calculating a mutual information value based upon said accumulated transition probability values;
  calculating a change in mutual information from a previous mutual information value; and
  adjusting said decision threshold values based on said change in mutual information.

10. The method of claim 9 wherein said encoded signal is an optical signal.

11. The method of claim 10 wherein said preset bits include bits in frame alignment words.

12. The method of claim 9 wherein said decision threshold values are adjusted to maximize said mutual information value.

13. The method of claim 9 wherein said transition probabilities are accumulated for preset bits in said binary data stream represented by said encoded signal.

14. The method of claim 9 wherein said soft decision error correction system is a 2-bit system, wherein said plurality of decision threshold values includes three decision threshold values, and wherein said detected multi-bit signal includes four multi-level values.

15. A method for obtaining decision thresholds in a soft decision error correction system, said method comprising:
  receiving an encoded signal representing a binary data stream;
  detecting said encoded signal using a plurality of decision threshold values to obtain a detected multi-bit signal including multi-level values corresponding to each of the bits in said binary data stream;
  monitoring said encoded signal to obtain channel noise distribution information;
  obtaining predetermined soft signal probability values corresponding to said channel noise distribution information;
  accumulating soft signal probability values corresponding to said multi-level values in said detected multi-bit signal;
  comparing said accumulated soft signal probability values for said detected multi-bit signal to said predetermined soft signal probability values corresponding to said channel noise distribution to determine threshold adjustment values for each of said decision threshold values; and
  adjusting said decision threshold values based on said threshold adjustment values.

16. The method of claim 15 wherein said encoded signal is an optical signal.

17. The method of claim 15 wherein said channel noise distribution information includes an optical signal-to-noise ratio (OSNR) for said encoded signal or a Q-factor for said encoded signal.

18. The method of claim 15 wherein said predetermined soft signal probability values are stored for different channel noise distribution information, and wherein said predetermined soft signal probability values are obtained by comparing said channel noise distribution information to said stored channel distribution information.

19. The method of claim 15 wherein said soft decision error correction system is a 2-bit system, wherein said plurality of decision threshold values includes three decision threshold values, and wherein said detected multi-bit signal includes four multi-level values.

20. An optical receiver comprising:
  a soft-decision detector for receiving an encoded optical signal representing a binary data stream and for detecting said encoded signal using a plurality of decision threshold values to obtain a detected multi-bit signal including multi-level values corresponding to each of the bits in said binary data stream; and
  a soft-decision decision threshold adjuster for adjusting said decision threshold values based on mutual information of said detected multi-bit signal.

21. The optical receiver of claim 20 wherein said soft-decision decision threshold adjuster is configured to adjust said decision threshold values according to the method comprising:
  accumulating transition probability values corresponding to said multi-level values in said multi-bit signal;
  calculating a mutual information value based upon said accumulated transition probability values;
  calculating a change in mutual information from a previous mutual information value; and
  adjusting said decision threshold values based on said change in mutual information.

22. The optical receiver of claim 20 wherein said soft-decision decision threshold adjuster is configured to adjust said decision threshold values according to the method comprising:
  monitoring said encoded signal to obtain channel noise distribution information; obtaining predetermined soft signal probability values corresponding to said channel noise distribution information;
  accumulating soft signal probability values corresponding to said multi-level values in said detected multi-bit signal;

comparing said accumulated soft signal probability values for said detected multi-bit signal to said predetermined soft signal probability values corresponding to said channel noise distribution to determine threshold adjustment values for each of said decision threshold values; and adjusting said decision threshold values based on said threshold adjustment values.

23. The optical receiver of claim 20 wherein said threshold adjuster is configured to optimize said threshold values by maximizing said mutual information of said detected multi-bit signal.

24. The method of claim 20 wherein said soft-decision threshold adjuster is configured to adjust different groups of said decision threshold values separately using a recursive algorithm that separately calculates said groups of said decision threshold values based on maximum mutual information of said detected multi-bit signal.

25. An optical communications system comprising:

an optical transmitter comprising an encoder for encoding a binary data stream and a modulator for modulating said encoded binary data stream to produce an encoded optical signal;

an optical receiver for receiving said encoded optical signal from said optical transmitter, said optical receiver comprising:

a demodulator for demodulating said encoded optical signal;

a soft-decision detector for detecting said demodulated encoded optical signal using a plurality of decision threshold values to obtain a detected multi-bit signal including multi-level values corresponding to each of the bits in said binary data stream; and a soft-decision decision threshold adjuster for adjusting said decision threshold values based on mutual information of said detected multi-bit signal.

* * * * *